(12) United States Patent
Weber

(10) Patent No.: US 8,637,940 B2
(45) Date of Patent: Jan. 28, 2014

(54) SEMICONDUCTOR DEVICE WITH SELF-CHARGING FIELD ELECTRODES AND COMPENSATION REGIONS

(75) Inventor: Hans Weber, Bayerisch Gmain (DE)

(73) Assignee: Infineon Technologies Austria AG, Villach (AT)

( * ) Notice: Subject to any disclaimer, the term of this patent is extended or adjusted under 35 U.S.C. 154(b) by 23 days.

(21) Appl. No.: 13/331,843

(22) Filed: Dec. 20, 2011

(65) Prior Publication Data
US 2013/0154030 A1 Jun. 20, 2013

(51) Int. Cl.
*H01L 29/66* (2006.01)

(52) U.S. Cl.
USPC .......................................... 257/409; 257/341

(58) Field of Classification Search
USPC .............. 257/329, 409, 474, E21.19, E21.41; 438/589
See application file for complete search history.

(56) References Cited

U.S. PATENT DOCUMENTS

| | | | |
|---|---|---|---|
| 7,173,306 B2 * | 2/2007 | Hirler et al. ................... | 257/329 |
| 2002/0121678 A1 * | 9/2002 | Huang ......................... | 257/656 |
| 2004/0031987 A1 * | 2/2004 | Henninger et al. ........... | 257/328 |
| 2006/0121678 A1 * | 6/2006 | Brask et al. ................... | 438/287 |
| 2007/0023830 A1 * | 2/2007 | Pfirsch et al. ................. | 257/341 |
| 2007/0114600 A1 * | 5/2007 | Hirler et al. ................... | 257/330 |
| 2007/0296039 A1 * | 12/2007 | Chidambarrao et al. ..... | 257/355 |
| 2008/0258208 A1 * | 10/2008 | Hirler et al. ................... | 257/328 |

OTHER PUBLICATIONS

Weber et al., "Semiconductor Device With Self-Charging Field Electrodes", U.S. Appl. No. 13/250,013, filed Sep. 30, 2011.

* cited by examiner

*Primary Examiner* — Yu-Hsi D Sun
*Assistant Examiner* — Christina Sylvia
(74) *Attorney, Agent, or Firm* — Murphy, Bilak & Homiller, PLLC

(57) ABSTRACT

A semiconductor device includes a drift region of a first doping type, a junction between the drift region and a device region, a compensation region of a second doping type, and at least one field electrode structure arranged between the drift region and the compensation region. The at least one field electrode includes a field electrode and a field electrode dielectric adjoining the field electrode. The field electrode dielectric is arranged between the field electrode and the drift region and between the field electrode and the compensation. The field electrode dielectric includes a first opening through which the field electrode is coupled to drift region and a second opening through which the field electrode is coupled to the compensation region.

24 Claims, 12 Drawing Sheets

SEMICONDUCTOR DEVICE WITH SELF-CHARGING FIELD ELECTRODES AND COMPENSATION REGIONS

TECHNICAL FIELD

Embodiments of the present invention relate to a semiconductor device, in particular a power semiconductor device.

BACKGROUND

Power semiconductor devices, such as power MOS (metal oxide semiconductor) transistors or power diodes, include a drift region and a pn junction between the drift region and a body region in an MOS transistor and between the drift region and an emitter region in a diode. The doping concentration of the drift region is lower than the doping concentration of the body and emitter region, so that a depletion region (space charge region) mainly expands in the drift region when the device blocks, which is when the pn junction is reverse biased.

The dimension of the drift region in a current flow direction of the device and the doping concentration of the drift region mainly define the voltage blocking capability of the semiconductor device. In a unipolar device, such as a power MOSFET (metal oxide semiconductor field effect transistor), the doping concentration of the drift region also defines the on-resistance of the device, which is the electrical resistance of the semiconductor device in the on-state.

When the pn junction is reverse biased dopant atoms are ionized on both sides of the pn junction resulting in a space charge region that is associated with an electrical field. The integral of the magnitude of the field strength of the electrical field corresponds to the voltage that reverse biases the pn junction, where the maximum of the electrical field is at the pn junction. An Avalanche breakthrough occurs when the maximum of the electrical field reaches a critical field strength that is dependent on the type of semiconductor material used to implement the drift region.

The doping concentration of the drift region may be increased without reducing the voltage blocking capability of the device when charges are provided in the drift region that may act as counter charges to ionized dopant atoms in the drift region when the pn junction is reverse biased, which is when a depletion region expands in the drift region.

According to a known concept, field electrodes or field plates are provided in the drift region and are dielectrically insulated from the drift region by a field electrode dielectric. These field electrodes may provide the required counter charges.

According to one known concept, these field electrodes are electrically connected to a fixed electrical potential, such as gate or source potential in a MOSFET. However, this may result in a high voltage between the field electrode and those regions of the drift region close to the drain region in a MOSFET, so that a thick field electrode dielectric would be required. A thick field electrode dielectric, however, is space consuming.

According to a further known concept, several field electrodes are arranged distant to each other in a current flow direction of the drift region and these field electrodes are connected to different voltage sources, so as to bias these field electrodes to different potentials. Implementing the voltage sources, however, is difficult.

According to yet another known concept, the field electrodes are electrically connected to a doped semiconductor region of the same doping type as the drift region through a contact electrode arranged above a semiconductor body. This "coupling region" is at least partially shielded against the drift region by a semiconductor region of a complementary doping type.

According to still another known concept, the drift region includes compensation regions doped complementarily to the drift region and electrically coupled to the body region.

There is a need to reduce the on-resistance and to increase the voltage blocking capability of a semiconductor device with a drift region.

SUMMARY

A first embodiment relates to a semiconductor device including a drift region of a first doping type, a junction between the drift region and a device region, a compensation region of a second doping type, and at least one field electrode structure. The at least one field electrode structure is arranged between the drift region and the compensation region and includes a field electrode and a field electrode dielectric adjoining the field electrode. The field electrode dielectric is arranged between the field electrode and the drift region and between the field electrode and the compensation region and includes a first opening through which the field electrode is coupled to drift region and a second opening through which the field electrode is coupled to the compensation region.

A second embodiment relates to a semiconductor device including a drift region of a first doping type, a junction between the drift region and a device region, and at least one field electrode structure in the drift region. The at least one field electrode structure includes a field electrode, a field electrode dielectric adjoining the field electrode and arranged between the field electrode and the drift region, and having an opening, and at least one of a field stop region and a generation region. The at least one field stop region is of the first doping type and more highly doped than the drift region, and the at least one field stop region connects the field electrode to the drift region through the opening of the field electrode dielectric. The generation region connects the field electrode to the drift region through the opening of the field electrode dielectric or is arranged in the field electrode. The semiconductor device further includes a compensation region of a second doping type adjoining the drift region and connected to device region.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 16 which includes

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the FIGs. being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
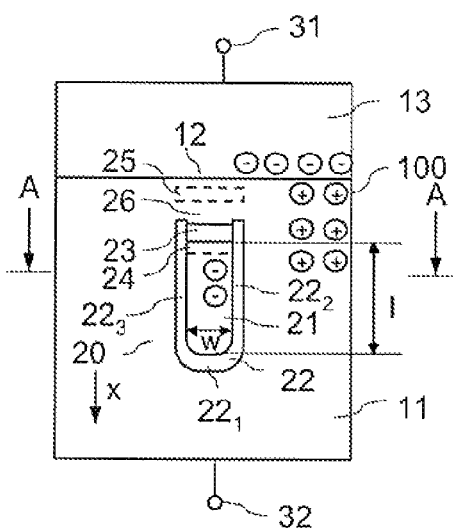
FIG. 1 illustrates a cross sectional view of a semiconductor device including a field electrode structure according to a first embodiment.

FIG. 1 illustrates a cross sectional view of a semiconductor device according to a first embodiment. The semiconductor device includes a semiconductor body 100, a drift region 11 of a first doping type and a junction 12 between the drift region 11 and a further device region 13. The junction 12 is either a pn junction or a Schottky junction. In the first case, the further device region 13 is a semiconductor region of a second doping type complementary to the first doping type. In the second case, the further device region 13 is a Schottky region or Schottky metal, such as, for example, aluminum (Al), tungsten silicide (WSi), tantalum silicide (TaSi), titanium silicide (TiSi), platinum silicide (PtSi), or cobalt silicide (CoSi).

The further device region 13 is electrically coupled to a first electrode or terminal 31, and the drift region 11 is electrically coupled or connected to a second electrode or terminal 32. The first and second electrodes 31, 32 are only schematically illustrated in FIG. 1.

The semiconductor device further includes at least one field electrode structure 20 in the drift region 11. The semiconductor device may include further device features, such as, for example, a gate electrode when the semiconductor device is implemented as an MOS transistor. However, in FIG. 1, as well as in FIGS. 2 to 9, only those features of the semiconductor device are illustrated that are necessary to understand the operating principle of the field electrode structure 20 arranged in the drift region 11. The field electrode structure 20 can be employed in each semiconductor device that includes a drift region, such as drift region 11 illustrated in FIG. 1, and a junction, such as junction 12 between the drift region 11 and the further device region 13 illustrated in FIG. 1. Semiconductor devices having a drift region and a junction between an drift region and a further device regions are, but are not limited to, MOS transistors, such as MOSFETs (Metal Oxide Gate Field-Effect Transistors) or IGBTs (Insulated Gate Bipolar Transistors), p-i-n diodes, Schottky diodes, JFETs (Junction Field-Effect Transistors). Field electrode structures 20 as explained with reference to FIGS. 1 to 9 may be employed in vertical devices, in which a current flow direction of the device corresponds to a vertical direction of a semiconductor body of the device, or in lateral devices in which a current flow direction of the device corresponds to a lateral (horizontal) direction of a semiconductor body of the device.

Referring to FIG. 1, the field electrode structure 20 includes a field electrode 21 and a field electrode dielectric 22. The field electrode dielectric 22 adjoins the field electrode 21, is arranged between the field electrode 21 and the drift region 11 and has an opening 26, so that the field electrode dielectric 22 does not completely surround the field electrode 21 within the drift region 11. The field electrode structure 20 further includes a field stop region 23 of the first doping type and more highly doped than the drift region 11. The field stop region 23 couples or connects the field electrode 21 to the drift region 11 through the opening 26 of the field electrode dielectric 22. The doping concentration of the drift region 11 is, for example, in the range of between $10^{14}$ cm$^{-3}$ (1e14 cm$^{-3}$) and $10^{18}$ cm$^{-3}$ (1e18 cm$^{-3}$). The doping concentration of the field stop region 23 is, for example, in the range of between $10^{16}$ cm$^{-3}$ (1e16 cm$^{-3}$) and $10^{20}$ cm$^{-3}$ (1e20 cm$^{-3}$). The doping of the field stop region 23 is such that the field stop region 23 cannot be completely depleted of charge carriers when the depletion region expanding in the drift region 11 reaches the field stop region 23. When the semiconductor body 100 includes silicon as a semiconductor material, the field stop region 23 cannot be completely depleted of charge carriers when a dopant dose in the field stop region 23 is higher than about $2 \cdot 10^{12}$ cm$^{-2}$ (2e12 cm$^{-2}$). The dopant dose of the field stop region 23 corresponds to the integral of the doping concentration of the field stop region 23 in the current flow direction x.

The field electrode dielectric 22 includes, for example, an oxide, a nitride, a high-k dielectric, a low-k dielectric, or the like. The field electrode dielectric 22 may even include a gas or a vacuum formed in a void surrounding the field electrode 21. According to one embodiment, the field electrode dielectric 22 is a composite layer with two or more different dielectric layers.

The semiconductor device has a current flow direction x, which is a direction in which charge carriers flow in the drift region 11 when the semiconductor device is conducting (is in an on-state). The field electrode 21 has a length l, which is a dimension of the field electrode 21 in the current flow direction x and has a width w, which is a dimension of the field electrode 21 in a direction perpendicular to the current flow direction x. The field electrode 21 may have a varying length and a varying width. In this case, the length "l" denotes the maximum of the length of the field electrode 21 and the width "w" defines the maximum of the width of the field electrode 21. The field electrode dielectric 22 basically has a U-shape with a bottom section $22_1$ and two leg sections $22_2$, $22_3$. The width w of the field electrode 21 is the dimension of the field electrode 21 between the two leg sections $22_2$, $22_3$ of the field electrode dielectric 22. As will be explained with reference to FIGS. 16A to 16D the U-shape of the field electrode dielectric 22 can be modified in many different ways. However, the modified U-shape also includes a bottom section $22_1$ and two leg sections $22_2$, $22_3$ defining the width w and between which the field electrode 21 is arranged.

An aspect ratio of the field electrode 21, which is the ratio between the length l and the width w is higher than 1, i.e. l/w>1. According to one embodiment, the aspect ratio l/w is between 1 and 50, in particular between 5 and 50. The thickness of the field electrode dielectric 22, which is dimension of the field electrode dielectric 22 between the field electrode 21 and the drift region 11, may vary. According to one embodiment, this thickness is between 10 nm and 2 μm.

The field electrode 22 has two longitudinal ends, which are those ends of the field electrode 21 in the direction of the current flow direction x. A first longitudinal end of the field electrode 21 faces the bottom section $22_1$ of the field electrode dielectric 22. The second longitudinal end of the field electrode 21 faces the opening 26 of the field electrode dielectric 22, where this opening 26 in the embodiment illustrated in FIG. 1 faces or is located in the direction of the junction 12 of the semiconductor device.

Before disclosing further details on possible implementations of the field electrode 21 and the field stop region 23 the basic operating principle of the semiconductor device, in particular of the field electrode structure 20, is explained with reference to FIG. 1. For explanation purposes it is assumed that the drift region 11 is n-doped, so that the junction 12 is reverse biased when a positive voltage is applied between the drift region 11 and the further device region 13 or between the second and first terminals 32, 31, respectively. However, the operating principle explained below also applies to semiconductor device with a p-doped drift correspondingly.

When the junction 12 is reverse biased a depletion region (space charge region) expands in the drift region 11 beginning at the junction 12. The width of the depletion region, which is a dimension of the depletion region in a direction perpendicular to junction 12, is dependent on the voltage that reverse biases the junction 12 (the width of the depletion region increases when the reverse biasing voltage increases). Within the depletion region there are ionized dopant atoms in the drift region 11. These ionized dopant atoms have a positive charge when the drift region 11 is n-doped (and have a negative charge when the drift region is p-doped). Negative charges corresponding to the positive charges in the drift region 11 are located in the further device region 13 on the other side of the junction 12. When the depletion region reaches the field stop region 23, an ionization process also sets in within the field stop region 23 which has the same doping type as the drift region 11. In an n-doped field-stop region 23 electrons are generated thereby leaving positive dopant ions in the field stop region 23 (these ionized dopant atoms are not illustrated in FIG. 1). By virtue of the electric field caused by the positively charged ionized dopant atoms in the field stop region 23 and the drift region 11 the electrons generated in the field stop region 23 are driven away from the junction 12 in the current flow direction x of the semiconductor device. The field stop region 23 is adjacent the field electrode 21 in the current flow direction so that the electrons generated in the field stop region 23 are driven into the field electrode 21. By virtue of the field electrode dielectric 22 the electrons are "trapped" in the field electrode 21, so that the field electrode 21 is negatively charged. Through this, not only the further device region 13 but also the field electrode 21 provides negative charges (counter charges) corresponding to positive charges in the drift region 11.

The voltage blocking capability of the semiconductor device is reached when the electrical field generated by ionized dopant atoms in the drift region 11 and corresponding counter charges in the further device region 13 reaches the critical electrical field. The critical electrical field is a material constant of the semiconductor material of the semiconductor body, such as silicon. The reverse biasing voltage at which the critical electrical field is reached at the junction 12 is dependent on the doping concentration of the drift region 11 and is, therefore, dependent on the number of dopant atoms that can be ionized when a reverse biasing voltage is applied to the junction 12. When, however, like in the semiconductor device of FIG. 1, ionized dopant atoms in the drift region 11 find corresponding counter charges not only in the further device region 13 on the other side of the junction 12 but also within the drift region 11, namely in the field electrode 21, the doping concentration of the drift region 11 can be increased without decreasing the voltage blocking capability of the semiconductor device. Increasing the doping concentration of the drift region 11 is beneficial concerning the on-resistance of the semiconductor device. In a unipolar semiconductor device, such as, for example a MOSFET or a Schottky diode, the on-resistance is mainly defined by the ohmic resistance of the drift region 11, where the ohmic resistance of the drift region 11 decreases when the doping concentration of the drift region 11 increases.

The field electrode 21 is adjacent the field stop region 23 in the current flow direction so that charge carriers flow from the field stop region 23 into the field electrode 21 where they are trapped. The process of generating charge carriers that are trapped in the field electrode 21 is reversible, which means electrons trapped in the field electrode 21 flow back into the field stop region 23 when the depletion region in the drift region 11 is removed by switching off the reverse biasing voltage.

The charge carriers that flow into the field electrode 21 when the depletion region reaches the field stop region 23 are n-type charge carriers (electrons) when the drift region 11 and the field stop region 23 are n-doped regions. In this case, the field electrode 21 is negatively charged. When, however, the drift region 11 and the field stop region 23 are p-doped regions, p-type charge carriers flow into the field electrode 21, thereby positively charging the field electrode. When, for example, the field electrode 21 includes a metal, the flowing of p-type charge carriers into the field electrons corresponds to the flowing of electrons from the metal field electrode 21 into the field stop region 23.

Referring to FIG. 1, the field stop region 23 can be arranged completely within the field electrode dielectric 23, so that the field stop region 23 does not extend beyond the opening 26 of the field electrode dielectric 22 in the current flow direction x of the semiconductor device. The field electrode 21 includes, for example, a monocrystalline semiconductor material of the first doping type, a polycrystalline or amorphous semiconductor material, or a metal. An electrically conductive contact or contact region 24 may be arranged between the field stop region 23 and the field electrode 21 that electrically connects the field stop region 23 to the field electrode 21. When the field electrode 21 is a monocrystalline semiconductor region of the first doping type, the doping concentration of the field electrode 21 may correspond to the doping concentration of the field stop region 23. In this case both functions (field stop and field electrode) may be provided within the same semiconductor region. However, it is also possible for the field stop region 23 and the field electrode 21 to have different doping concentrations. According to one embodiment, the doping concentration of the field electrode 21 corresponds to the doping concentration of the drift region 11.

Optionally, the field electrode structure 20 includes a shielding structure 25 arranged distant to the opening 26 of the field electrode dielectric 22 in the current flow direction x. The shielding structure 25 is in line with the field electrode structure 20. A width of the shielding structure 25, which is a dimension of the shielding structure 25 in a direction perpendicular to the current flow direction may correspond to a width of the field electrode structure 20 or may be larger than the width of the field electrode structure 20.

According to one embodiment, the shielding structure 25 only includes a dielectric, such as, for example, an oxide. According to a further embodiment, the shielding structure 25 includes an electrode dielectrically insulated from the semiconductor regions, such as the drift region 11, by a dielectric. The electrode is, for example, electrically connected to a reference potential. This reference potential may be the electrical potential of the first terminal. In a MOSFET, that will be explained with reference to FIGS. 17 to 20 below, the reference potential could also be the electrical potential of the gate electrode. An electrode of the shielding structure 25 connected to a reference potential may provide counter charges to the charges in the field stop region 23 when the device is in a blocking state. According to a further embodiment, the shielding structure 25 is a semiconductor region of a doping type complementary to the doping type of the drift region 11.

Figure 2:
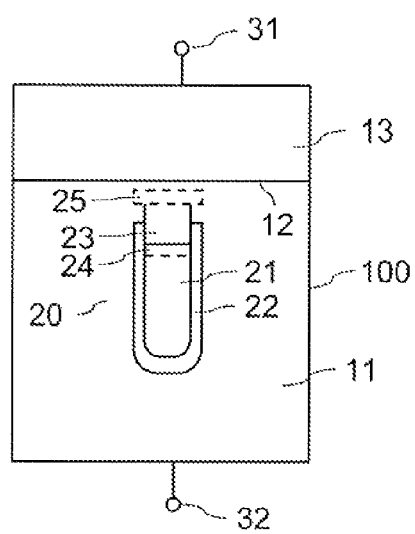
FIG. 2 illustrates a cross sectional view of a semiconductor device including a field electrode structure according to a second embodiment.

FIG. 2 illustrates a modification of the semiconductor device illustrated in FIG. 1. In the semiconductor device according to FIG. 2, the field stop region 23 extends through the opening 26 of the field electrode dielectric 22, so that the field stop region 23 extends beyond the opening 26 of the field electrode dielectric 22 in the current flow direction x. In the direction perpendicular to the current flow direction x the field stop region 23 does not extend beyond the field electrode dielectric 22 in the embodiment illustrated in FIG. 2.

Figure 3:
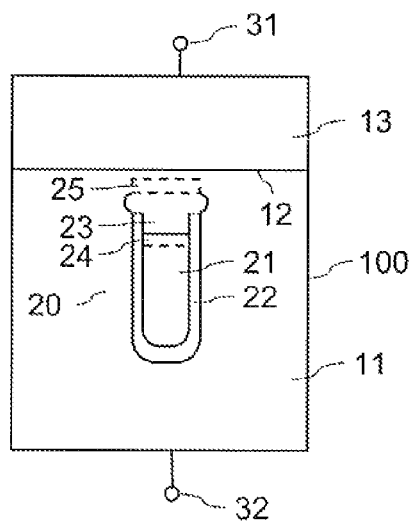
FIG. 3 illustrates a cross sectional view of a semiconductor device including a field electrode structure according to a third embodiment.

Referring to FIG. 3, the field stop region 23 may also extend beyond the field electrode dielectric 22 in the direction perpendicular to the current flow direction x. However, in this direction the field stop region 23 does not extend beyond the field electrode dielectric 22 more than 200 nm, more than 100 nm, or even not more than 50 nm.

In the embodiments illustrated in FIGS. 1 to 3 the field stop region 23 and the field electrode dielectric 22 completely separate the field electrode 21 and the drift region 11. However, this is only an example. According to a further embodiment illustrated in FIG. 4, a section of the field electrode 21 adjoins the drift region 11 next to the field stop region 23. In the embodiment illustrated in FIG. 4, the field stop region 23 has two field stop region sections between which the field electrode 21 extends to the drift region 11. However, this is only an example. According to a further embodiment (not illustrated) the field stop region 23 includes only one section. In the embodiment illustrated in FIG. 4, the field stop region 23 is completely arranged within the field electrode dielectric 22. However, the field stop region 23 could also extend beyond the opening of the field electrode dielectric 22 in the current flow direction.

Figure 4:
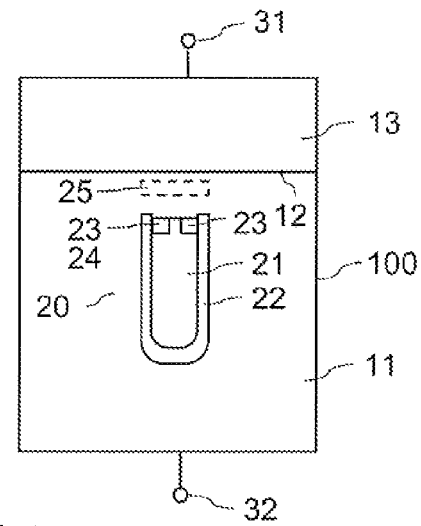
FIG. 4 illustrates a cross sectional view of a semiconductor device including a field electrode structure according to a fourth embodiment.
Figure 5:
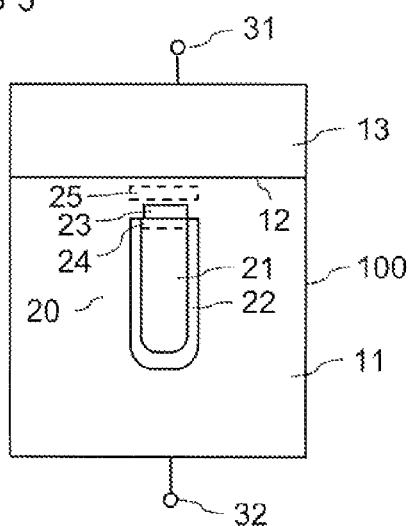
FIG. 5 illustrates a cross sectional view of a semiconductor device including a field electrode structure according to a fifth embodiment.

FIG. 5 illustrates a further embodiment of the semiconductor device. In this embodiment, the field stop region 23 is only arranged outside the field electrode dielectric 22. In this embodiment, the field electrode 21 or the optional contact 24 extends to the opening 26 of the field electrode dielectric 22 and adjoins the field stop region 23. In the embodiment illustrated in FIG. 5, the field stop region 23 (and the field electrode dielectric 22) completely separate the field electrode 21 and the drift region 11. However, this is only an example. There could also be sections of the field electrode 21 that adjoin the drift region 11, as illustrated in FIG. 4.

Figure 6:
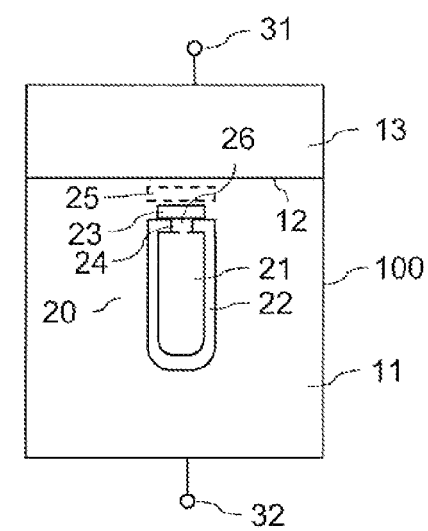
FIG. 6 illustrates a cross sectional view of a semiconductor device including a field electrode structure according to a sixth embodiment.

Although the size of the opening 26 corresponds to the width w of the field electrode 21 in the embodiments illustrated in FIGS. 1 to 5, this is only an example. Referring to FIG. 6, the field electrode dielectric 22 can be implemented with an opening 26 that is smaller than the width w of the field electrode 21. This small opening of the field electrode dielectric 22 can be employed with each of the embodiments explained with reference to FIGS. 1 to 5. Having the field stop region 23 arranged outside the field electrode dielectric 22 and adjoining the field electrode 21 or the contact 24 in the opening 26 as illustrated in FIG. 6, is only one of many different embodiments of implementing the field stop region 23 in connection with a smaller opening.

Figure 7:
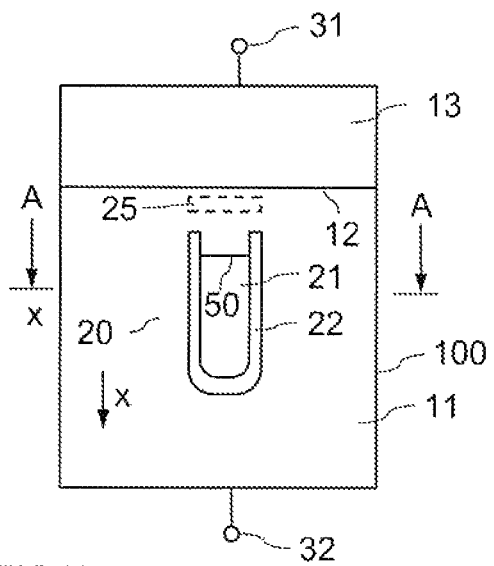
FIG. 7 illustrates a cross sectional view of a semiconductor device including a field electrode structure according to a seventh embodiment.

FIG. 7 illustrates a further embodiment of a semiconductor device with a field electrode structure 20. This field electrode structure 20 includes a generation region 50 configured to generate charge carrier pairs, namely holes and electrons, when the depletion region reaches the generation region 50 when the junction 12 is reverse biased. Unlike the field stop region 23 explained with reference to FIGS. 1 to 6 that generates a first type of charge carriers, namely electrons in the example explained before, flowing into the field electrode 21 and fixed charge carriers of a second type, namely positive ionized dopant atoms, the generation region 50 generates two types of charge carriers that can move within the drift region. For explanation purposes it is again assumed that the drift region 11 is an n-type drift region so that there are positive dopant ions (ionized dopant atoms) in the drift region 11 when the junction 12 is reverse biased. When the depletion region reaches the generation region 50 electrons and holes are generated, whereas electrons by virtue of the electric field are driven away from the junction 12 and into the field electrode 21 within the field electrode dielectric 22. The effect of trapping the electrons in the field electrode 21 is the same as explained with reference to FIG. 1. The holes are driven in the direction of the junction 12 and reach the first electrode 31 (that is only schematically illustrated and that may include a metal), where they recombine with electrons, or some of the holes accumulate at the optional shielding structure 25 that prevents the holes from flowing to the junction 12.

The at least one generation region 50 can be implemented in many different ways. According to one embodiment, the generation region 50 is an interface region between the field electrode 21 and the drift region 11. In this case, the field electrode 21 includes, for example, a metal, or a silicide. According to a further embodiment, the field electrode 21 includes a polycrystalline semiconductor material, an amorphous semiconductor material or a monocrystalline semiconductor material into which foreign material atoms are implanted or diffused or that includes crystal defects. Suitable foreign material atoms are, for example, heavy metal atoms, such as, for example, gold atoms, or platinum atoms. Crystal defects can be generated by implanting particles, such as argon (Ar) or germanium (Ge) atoms, semiconductor atoms, or the like, into the field electrode 21. When the field electrode 21 includes a polycrystalline or an amorphous semiconductor material or a monocrystalline semiconductor material with foreign material atoms or crystal defects, there is a plurality of generation regions 50 within the field electrode 21. Each of the foreign material atoms or each of the crystal defects in a monocrystalline material or the inherent crystal borders in a monocrystalline or an amorphous material may act as a generation region. The position of the generation region 50 relative to the field electrode 21 may correspond to the position of the field stop region 23 relative to the field electrode 21 explained before. Like the field stop region 23 explained with reference to FIGS. 1 to 6, the generation region 50 can be adjacent the field electrode 21 in the current flow direction x of the semiconductor device, so that charge carriers, such as electrons, that are generated in the generation region 50 flow into the field electrode 21 where they are trapped. However, it is also possible to provide at least one generation region 50 within the field electrode 21, for example, when the field electrode 21 includes a polycrystalline or an amorphous semiconductor material or a monocrystalline semiconductor material with crystal defects. Like the effect that has been explained with reference to the field stop region 23 charging the field electrode 21 is reversible. When the voltage that reverse biases the junction is reduced or switched off, charge carriers trapped in the field electrode 21 are removed from the field electrode 21, so as to discharge the field electrode 21. These charge carriers may either recombine at the generation region 50 with complementary charge carriers or may flow to one of the electrodes via the drift region 11. When, for example, the drift region 11 is n-doped, so that electrons are trapped in the field electrode 21 when the junction 12 is reverse biased, these electrons recombine with holes at the generation region 50 or flow to the second electrode 32 when the reverse biasing voltage is switched off or is reduced. The number of electrons that recombine with holes is dependent on the number of holes that are kept in the drift region 11 when the junction is reverse biased. When the junction is reverse biased, holes are, for example, kept at the shielding structure 25 that may act as a trap for charge carriers that are complementary to charge carriers that charge the field electrode 21.

The field electrode structure 20 may include a field stop region 23 and a generation region 50, which means, the field stop region 23 and the generation region 50 can be combined in one field electrode structure. When, for example, in the embodiment illustrated in FIG. 4, the field electrode 21 includes a metal, a polycrystalline or amorphous semiconductor material, or a monocrystalline semiconductor material with foreign material atoms or crystal defects there is a generation region at or close to the interface between the field electrode 21 and the drift region 11, or in the field electrode 21. According to a further embodiment (not illustrated), the semiconductor device includes a field stop region 23 of the same doping type as the drift region 11 as explained before and a semiconductor region of a complementary doping type. The field stop region 23 and the complementary semiconductor region are connected by a metallic electrode, and the complementary region may be arranged between the field stop region 23 and the field electrode 21. In this embodiment, the field stop region 23, the metallic electrode and the complementary region form a generation region, so that both a field stop region and a generation region are available in this device.

Figure 8:
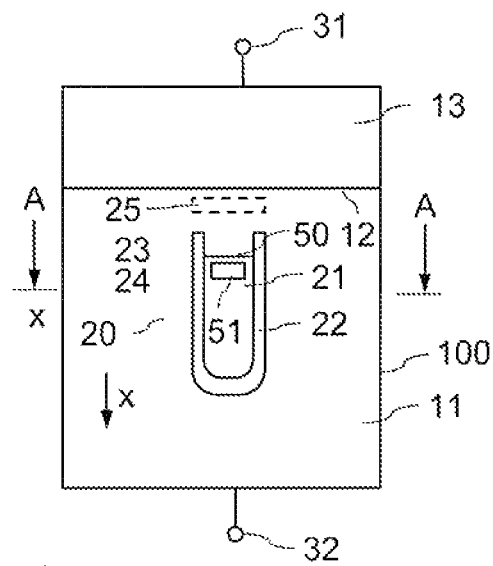
FIG. 8 illustrates a cross sectional view of a semiconductor device including a field electrode structure according to an eighth embodiment.

FIG. 8 illustrates a further embodiment of a semiconductor device including a field electrode structure 20 with a generation region 50. In this embodiment, the field electrode 21 includes a metal or silicide region 51. This metal or silicide region 51 or an interface between the metal or silicide region 51 and the field electrode 21 acts as a generation region. Dependent on the implementation of the field electrode 21, the generation region formed by the metal or silicide region 51 may be the only generation region in the device or may be one of several generation regions. According to one embodiment, the field electrode 21 includes a monocrystalline semiconductor material. In this case, a generation region is only formed at the interface between the metal or silicide region 51 and the field electrode 21. According to a further embodiment, the field electrode 21 includes a polycrystalline or an amorphous semiconductor material, or a monocrystalline semiconductor material with foreign material atoms or crystal defects. In this case, there are additional generation regions in the field electrode 21.

Figure 9:
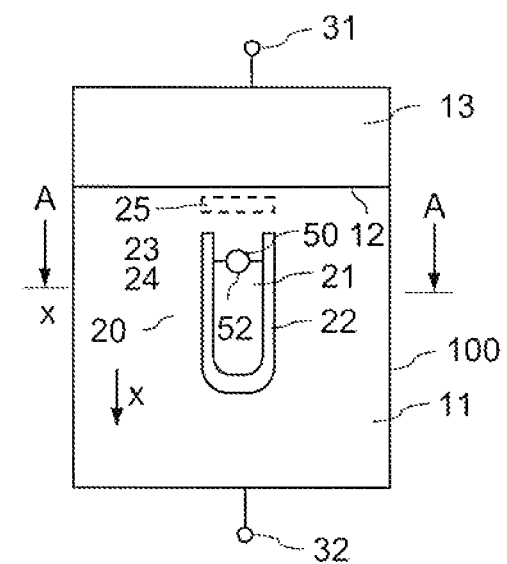
FIG. 9 illustrates a cross sectional view of a semiconductor device including a field electrode structure according to a ninth embodiment.

Referring to FIG. 9, the generation region 50 may include a void 52 adjoining the drift region 11. The interface between the drift region 11 and the void 52 acts as generation region 50. In the embodiment illustrated in FIG. 9, the void 52 also extends into the field electrode 21. However, this is only an example. The void 52 could also be distant to the field electrode 21. Like the field stop region 23 explained with reference to FIGS. 1 to 6, the generation region 50 is arranged adjacent or neighboring the field electrode 21 in the current flow direction x of the semiconductor device. The generation region 50 can be arranged within the field electrode dielectric 22 or could also be arranged outside the field electrode dielectric 22 but in line with the field electrode 21 in the current flow direction x so that charge carriers generated in the generation region 50 are driven through the opening 26 into the field electrode 21.

Figure 10:
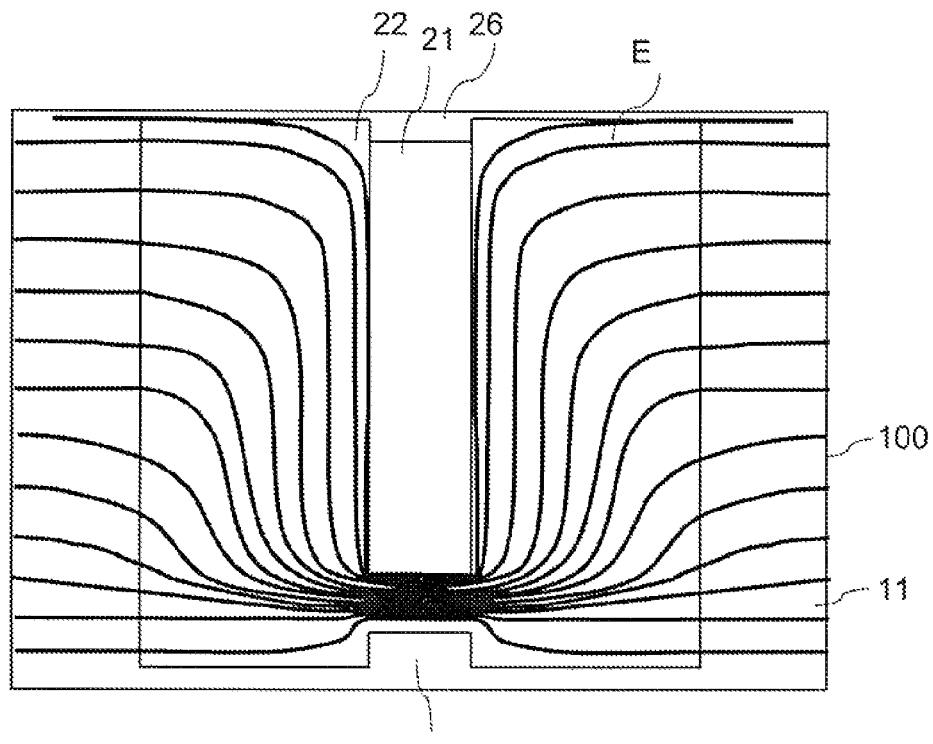
FIG. 10 illustrates equipotential lines in semiconductor device in the region of the field electrode structure when the semiconductor device is blocking.

FIG. 10 schematically illustrates equipotential lines of an electric potential in the region of the field electrode 21 and the field electrode dielectric 22 in a semiconductor device when the junction (not illustrated in FIG. 10) is reverse biased. The figure applies to semiconductor devices that include either a field stop region, such as the field stop region 23 explained with reference to FIGS. 1 to 6, or a generation region, such as the generation region 50 explained with reference to FIGS. 7 to 9. As can be seen from FIG. 10, there is no electric field within the field electrode 21. The electric potential of the field electrode 21 corresponds to the electrical potential, the drift region 11 has at a position at which the field stop region 23 or the generation region 50 is located. In FIG. 10, the field electrode dielectric 22 below the field electrode 21 is drawn to be thinner than the field electrode dielectric 22 along sidewalls of the field electrode 21. However, the field electrode dielectric 22 below the field electrode 21 could be as thick as the field electrode dielectric 22 along sidewalls of the field electrode 21.

Figure 11:
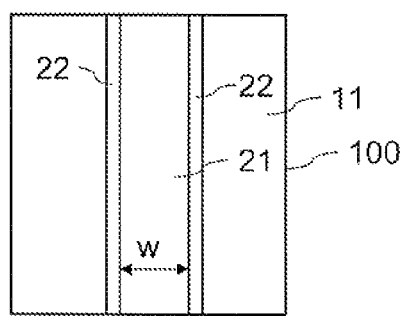
FIG. 11 illustrates a stripe-shaped field electrode structure.

FIG. 11 illustrates a cross sectional view of the semiconductor body 100 in a section plane A-A that is illustrated in FIG. 1. This section plane A-A cuts through the field electrode 21 and the field electrode dielectric 22 and is perpendicular to the section plane illustrated in FIGS. 1 to 9. In the embodiment illustrated in FIG. 11, the field electrode 21 has a stripe-shape and extends longitudinally in a direction perpendicular to a direction in which the width w of the field electrode 21 is defined.

Figure 12:
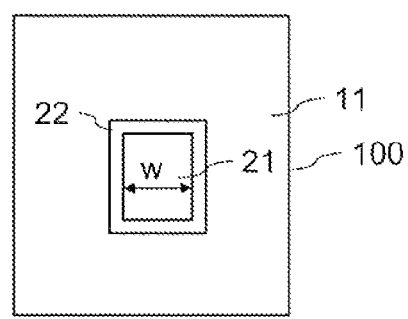
FIG. 12 illustrates a pile-shaped field electrode structure.

FIG. 12 illustrates a further embodiment in which the field electrode 21 has a pile-shape. In the embodiment illustrated in FIG. 12, the field electrode 21 has a rectangular cross section. However, this is only an example. The pile-shaped field electrode 21 could also have any other cross sections, such as, for example an elliptical cross section, a hexagonal cross section, or any other polygonal cross section.

Figure 13:
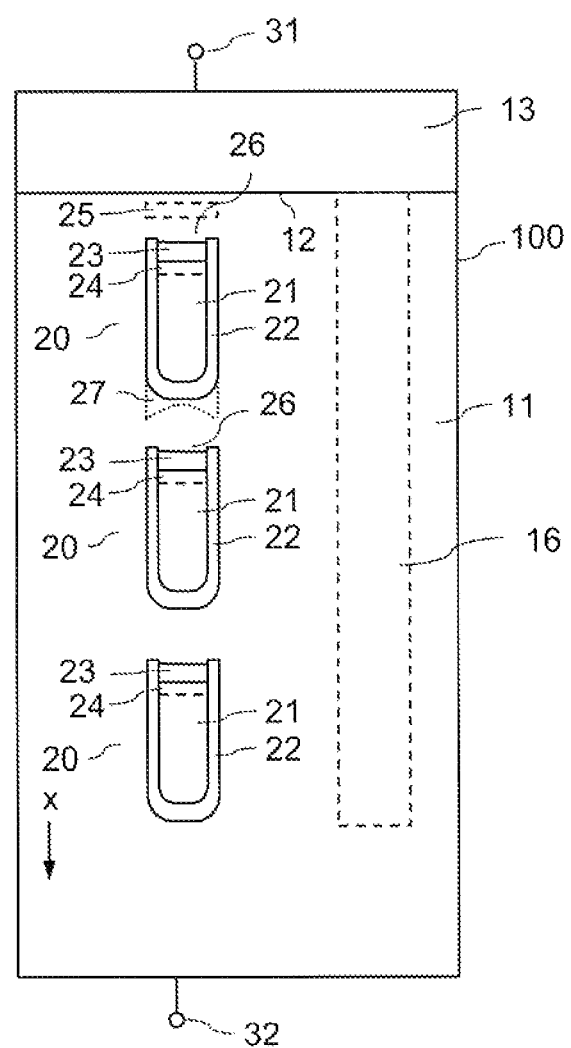
FIG. 13 illustrates a cross sectional view of a semiconductor device according to a first embodiment that includes a plurality of field electrode structures arranged in line with each other in a current flow directional of the semiconductor device.

FIG. 13 illustrates a cross sectional view of an embodiment of a semiconductor device that includes a plurality of field electrode structures 20 that are distant to each other in the current flow direction x of the semiconductor device. The semiconductor device according to FIG. 13 includes three field electrode structures 20. However, this is only an example. The number of field electrode structures 20 can be selected arbitrarily, in particular dependent on the desired voltage blocking capability of the semiconductor device and dependent on the length of the drift region 11. The length of the drift region 11 is the dimension of the drift region 11 in the current flow direction. When in the device according to FIG. 13, the junction 12 is reverse biased so that a depletion region expands in the drift region 11, the depletion region first reaches the field electrode structure 20 arranged closest to the junction 12 so that the field electrode 21 of this field electrode structure 20 is biased in order to provide counter charges to ionized dopant atoms in the drift region 11. When the depletion region propagates further in the drift region 11, and reaches a next field electrode structure 20, the field electrode 21 of this field electrode structure 20 is also biased. This process proceeds, when the voltage reverse biasing the junction 12 increases, until the field electrode 21 of the field electrode structure 20 most distant to the junction 12 is biased.

The field electrode structures 20 illustrated in FIG. 13 correspond to the field electrode structure 20 explained with reference to FIG. 1. However, this is only an example. Any other field electrode structure 20 with a field stop region 23 and/or a generation region 50 explained hereinbefore could be employed in the semiconductor device according to FIG. 13 as well. According to one embodiment, the individual field electrode structures 20 are implemented in the same way. According to a further embodiment, different field electrode structures 20 are employed in one semiconductor device.

In the semiconductor device according to FIG. 13, the individual field electrode structures 20 are in line with each other in the current flow direction x. The optional shielding structure 25 is arranged between the field electrode structure 20 arranged closest to the junction 12 and the junction 12. For the remaining field electrode structures 20 a neighboring field electrode structure, in particular the field electrode dielectric 22 of the neighboring field electrode structure acts as a shielding structure, so that no additional shielding structures are required for these field electrode structures.

Referring to what is illustrated in dotted lines in FIG. 13, the semiconductor device may include a charge carrier trap 27 for charge carriers of a charge carrier type complementary to the charge carriers trapped in the field electrode 21 when the junction 12 is reverse biased. In particular when the field electrode structure 20 includes a generation region those complementary charge carriers are generated when the field electrode 21 is charged or biased. In the embodiment illustrated in FIG. 13, the charge carrier trap 27 is arranged at the field electrode dielectric 22 at that longitudinal end of the field electrode 21 that faces away from the opening 26. The charge carrier trap 27 may include a curved surface (as illustrated in FIG. 13) that faces the opening 26 of a neighboring field electrode structure 20, or may include a plane surface (not illustrated). The charge carrier trap 27 may be formed as a section of the field electrode dielectric 22 and may include the same material as the field electrode dielectric 22. One charge carrier trap 27 formed at one end of one field electrode structure 20 traps charge carriers generated in a generation region (not shown in FIG. 13) of a neighboring field electrode structure 20. The shielding structure 25 adjacent the field electrode structure 20 that is closest to the junction 12 may act as a charge carrier trap for complementary charge carriers generated in this field electrode structure 20.

Figure 14:
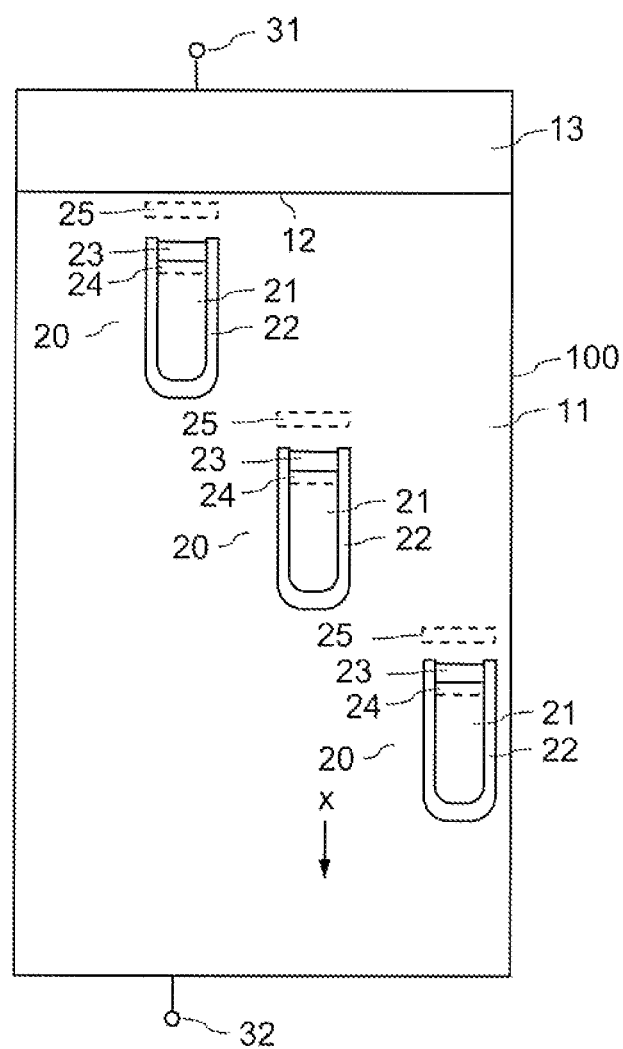
FIG. 14 illustrates a cross sectional view of a semiconductor device according to a second embodiment that includes a plurality of field electrode structures arranged offset in a direction perpendicular to the current flow direction.

FIG. 14 illustrates a further embodiment of a semiconductor device with a plurality of field electrode structures 20. In this semiconductor device the individual field electrode structures 20 are also arranged distant in the current flow direction x. However, the individual field electrode structures 20 are not in line with each other but are offset in a direction perpendicular to the current flow direction x. According to one embodiment, the structure illustrated in FIG. 14 is employed as an edge termination structure in a vertical semiconductor device. In this case, the structure with the offset field electrode structure is arranged in an edge region of the semiconductor body 100, which is a region of the semiconductor body 100 close to a (vertical) edge of the semiconductor body 100. Especially when used as an edge termination structure, the optional shielding structures adjacent the individual field electrode structures 20 can be omitted.

Figure 15:
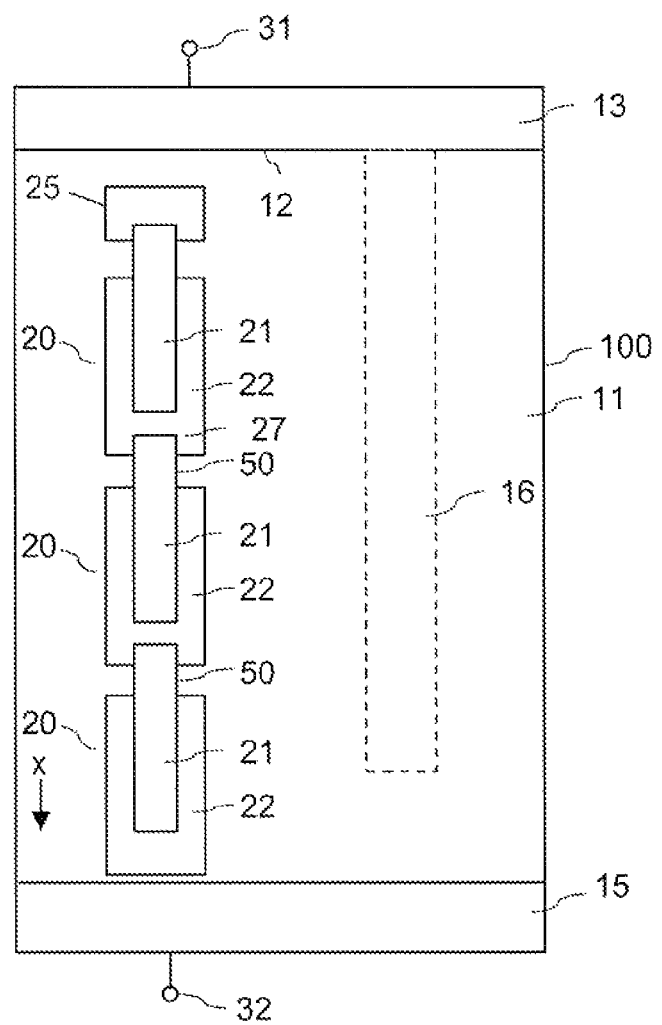
FIG. 15 illustrates a further embodiment of a semiconductor device including a plurality of field electrode structures.

FIG. 15 illustrates a further embodiment of a semiconductor device that includes a plurality of field electrode structures 20. In this semiconductor device, a generation region 50 is formed between the field electrode 21 and the drift region 11 and/or within the field electrode 21. Further, the field electrode 21 of a field electrode structure 20 arranged closest to the junction 12 extends to a shielding structure 25. The field electrodes 21 of the other field electrode structures 20 in the current flow direction x extend to or into the field electrode dielectric 22 of a neighboring field electrode structure 20. Those regions of the field electrode dielectric 22 of one field electrode structure 20 to which or into which the field electrode 21 of a neighboring field electrode structure extends form a charge carrier trap 27 of complementary charge carriers. The generation regions 50 are interfaces between the field electrodes 21 and the drift region 11 that are distant to an outer edge of the field electrode dielectric 22 in the direction perpendicular to the current flow direction or the generation regions are arranged within the field electrodes 21. In each case, these generation regions 50 do not extend beyond the field electrode dielectric 22 in the direction perpendicular to the current flow direction.

Figures 16A, 16B, 16C, 16D:
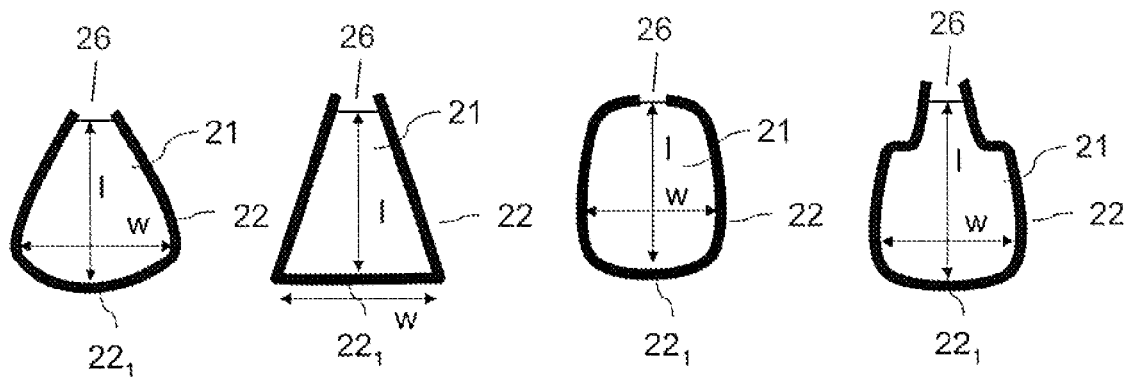
FIGS. 16A to 16D illustrates further embodiments of a field electrode and a field electrode dielectric of the field electrode structure.

Referring to the explanation above, the field electrode dielectric 22 basically is U-shaped, with a bottom section $22_1$ and two opposing leg sections $22_2$, $22_3$. Referring to FIGS. 16A to 16D this U-shape may be modified in many different ways. FIGS. 16A to 16D schematically illustrate embodiments of possible forms or geometries of the field electrode dielectric 22. Referring to FIGS. 16A and 16B the field electrode 21 and, therefore, the U-shape of the field electrode dielectric 22 may narrow in the direction of the opening 26. In the embodiment illustrated in FIG. 16C, the field electrode 21 has approximately a constant width, wherein the field electrode dielectric 22 only narrows in a region close to the opening 26. Referring to FIG. 16D the field electrode dielectric 22 could also be bottle-shaped. FIGS. 16A to 16D illustrate only several of many possible ways in which the U-shape of the field electrode dielectric 22 can be modified.

Figure 17:
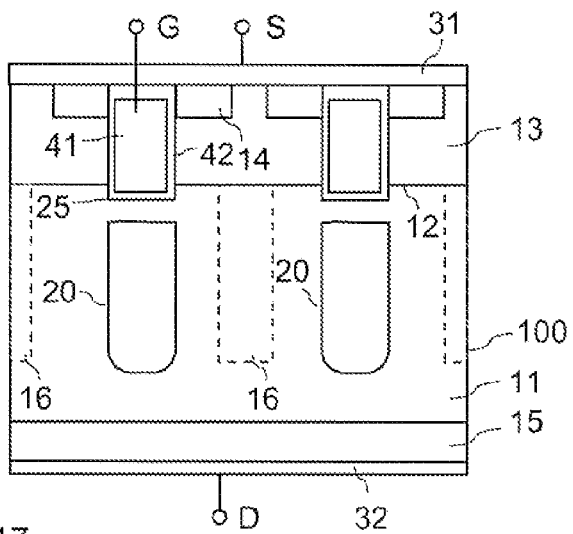
FIG. 17 illustrates a first embodiment of a semiconductor device implemented as a transistor.

FIG. 17 illustrates a cross sectional view of a semiconductor device with a field electrode structure 20 implemented as an MOS transistor. In FIG. 17, as well as in FIGS. 18 to 21, the field electrode structures 20 are only schematically illustrated. Each of the field electrode structures 20 explained with reference to FIGS. 1 to 16 herein below may be employed in these semiconductor devices. Referring to FIG. 17, the further device region 13 forms a body region of the MOS transistor and is doped complementarily to the drift region 11. The junction 12 between the drift region 11 and the body region 13 is a pn junction in this device. The MOS transistor further includes a source region 14 and a drain region 15. The body region 13 is arranged between the source region 14 and the drift region 11, and the drift region 13 is arranged between the body region 13 and the drain region 15. A gate electrode 41 is adjacent to the body region 13 and is dielectrically insulated from the body region 13 by a gate dielectric 42.

The MOS transistor can be implemented as an enhancement transistor (normally-off transistor). In this case, the body region 13 adjoins the gate dielectric 42. The semiconductor device could also be implemented as a depletion transistor (normally-on transistor). In this case, a channel region (not shown) of the same doping type as the source region 14 and the drift region 11 extends between the source region 14 and the drift region 11 along the gate dielectric 42 in the body region 13.

The MOS transistor can be implemented as an n-type transistor. In this case, the source region 14 and the drift region 11 are n-doped, while the body region 13 is p-doped. The semiconductor device could also be implemented as a p-type transistor. In this case, the source region 14 and the drift region 11 are p-doped, while the body region 13 is n-doped. Further, the MOS transistor can be implemented as a MOSFET or as an IGBT. In a MOSFET, the drain region 15 is of the same doping type as the drift region 11, while in an IGBT the drain region 15 is doped complementarily. In an IGBT the drain region 15 is also referred to as collector region instead of drain region.

The MOS transistor according to FIG. 17 can be implemented as a vertical transistor. In this case, the source region 14 and the drain region 15 are arranged distant in a vertical direction of the semiconductor body 100, the vertical direction being a direction perpendicular to first and second opposing surfaces of the semiconductor body 100. In a vertical transistor the current flow direction x corresponds to the vertical direction of the semiconductor body 100. However, the transistor could also be implemented as a lateral transistor. In this case, the source region 14 and the drain region 15 are arranged distant in a lateral or horizontal direction of the semiconductor body 100, so that source and drain electrodes of the transistor are arranged on one side of the semiconductor body. In the MOS transistor according to FIG. 17, the first electrode 31 forms a source electrode that contacts the source and body regions 14, 13 and that is connected to a source terminal S, while the second electrode 32 forms a drain electrode that is electrically connected to a drain terminal D. The gate electrode 41 is electrically connected to a gate terminal G. Like a conventional transistor the transistor according to FIG. 17 may include a plurality of identical transistor cells, with each transistor cell including a source region 14, a body region 13 and a section of the gate electrode 41. The drift region 11 and the drain region 15 can be common to the individual transistor cells. The individual transistor cells are connected in parallel in that the individual source regions 14 are connected to the source electrode 31 and in that the individual gate electrodes 41 are connected to a common gate terminal G.

In the transistor device according to FIG. 17 the field electrode structures 20 are in line with the gate electrode 41 and the gate dielectric 42 in the current flow direction x. The geometry of the field electrodes (not illustrated in FIG. 17) in a plane perpendicular to the plane illustrated in FIG. 17 may correspond to the geometry of the gate electrode 41 in this plane. In the semiconductor device according to FIG. 17 only one field electrode structure 20 is arranged in line with one gate electrode or gate electrode section 41. However, this is only an example. Referring to the embodiments illustrated in FIGS. 13 to 15 a plurality of field electrode structures 20 may be arranged in line with each other in the current flow direction x.

In the embodiment according to FIG. 17, in which the field electrode structures 20 are arranged in line with the gate electrodes 41 and the gate dielectric 42, the gate electrode 41 and the gate dielectric 42 act as a shielding structure 25 and/or as a charge carrier trap, so that no additional shielding structure is required.

The MOS transistor according to FIG. 17 can be operated like a conventional MOS transistor that can be switched on and off by applying a suitable drive potential to the gate electrode 41. When the MOS transistor is switched off and a voltage is applied between the drain and source terminals D, S that reverse biases the pn junction between the drift region 11 and the body region 13, field electrodes (not shown in FIG. 17) of the field electrode structures 20 are biased as explained before so as to provide counter charges to dopant charges in the drift region 11.

Figure 18:
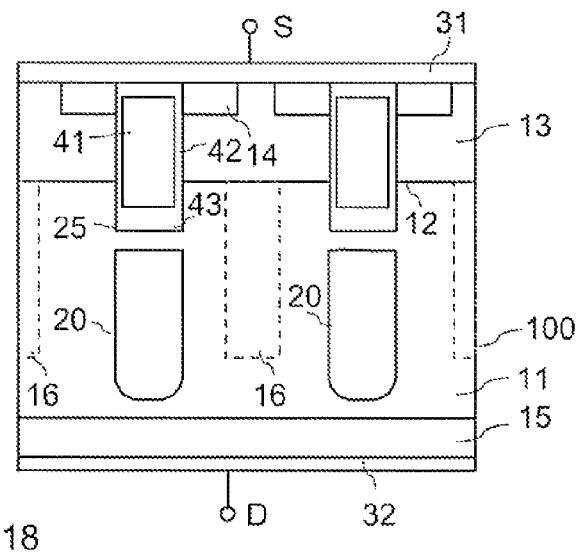
FIG. 18 illustrates a second embodiment of a semiconductor device implemented as a transistor.

FIG. 18 illustrates a further embodiment of a semiconductor device implemented as an MOS transistor. The semiconductor device of FIG. 18 is a modification of the semiconductor device of FIG. 17, where in the embodiment of FIG. 18 a dielectric layer 43 between the gate electrode 41 and the drift region 11 is thicker than the gate dielectric 42. The thickness of this dielectric layer 43 is, for example, between 100-nm and 500 nm.

Figure 19:
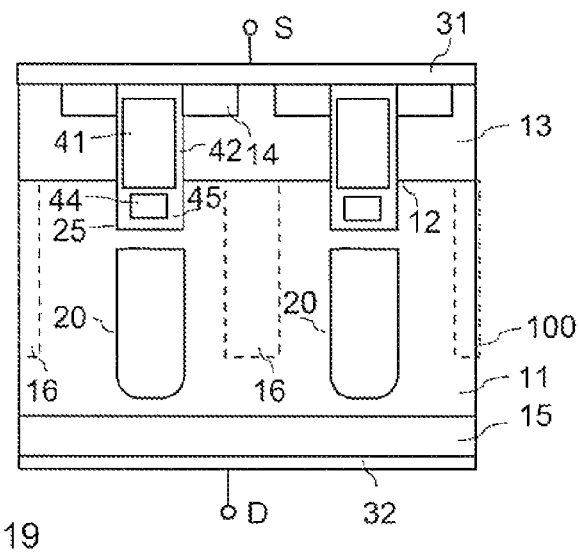
FIG. 19 illustrates a third embodiment of a semiconductor device implemented as a transistor.

FIG. 19 illustrates a further modification of the semiconductor device illustrated in FIG. 17. The semiconductor device of FIG. 19 includes a further field plate or field electrode 44. This further field electrode 44 is dielectrically insulated from the drift region 11 by a further field electrode dielectric 45. The further field electrode 44 is electrically connected to the source terminal S or the gate terminal G in a manner not illustrated in FIG. 19 and includes, for example, a metal or a polycrystalline semiconductor material. In the embodiment illustrated in FIG. 19, the further field electrode 44 is formed in the same trench as the gate electrode 41, so that the further field electrode 44 is in line with the gate electrode 41. However, this is only an example. The further field electrode 44 and the gate electrode 41 could also be implemented in different trenches.

Figure 20:
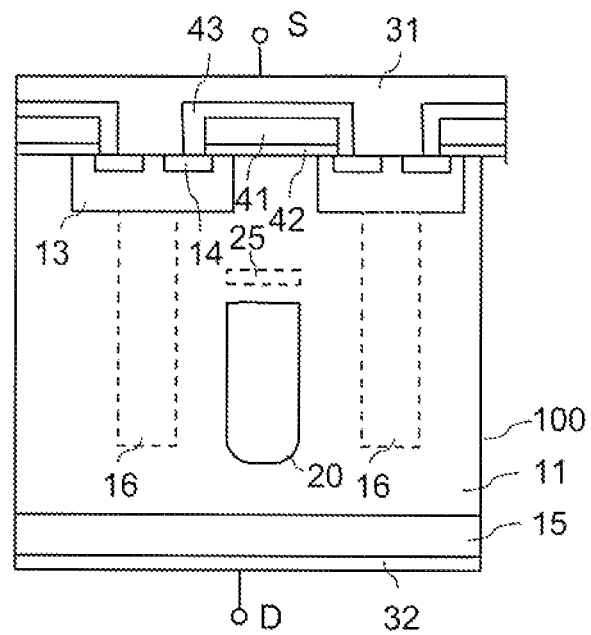
FIG. 20 illustrates a fourth embodiment of a semiconductor device implemented as a transistor.

In the embodiments illustrated in FIGS. 17 to 19, the gate electrode 41 is implemented as a trench electrode arranged in a trench of the semiconductor body 100. However, this is only an example. Any other type of gate electrode geometry may be applied as well. FIG. 20 illustrates a cross sectional view of a vertical transistor device with a planar gate electrode 41, which is a gate electrode arranged above a first surface of the semiconductor body 100. In this embodiment, the drift region 12 includes sections that extend to the first surface of the semiconductor body 100 and to the gate dielectric 42 arranged above the first surface. The body region 13 may act as shielding structure, so that no additional shielding structure 25 is necessary.

Figure 21:
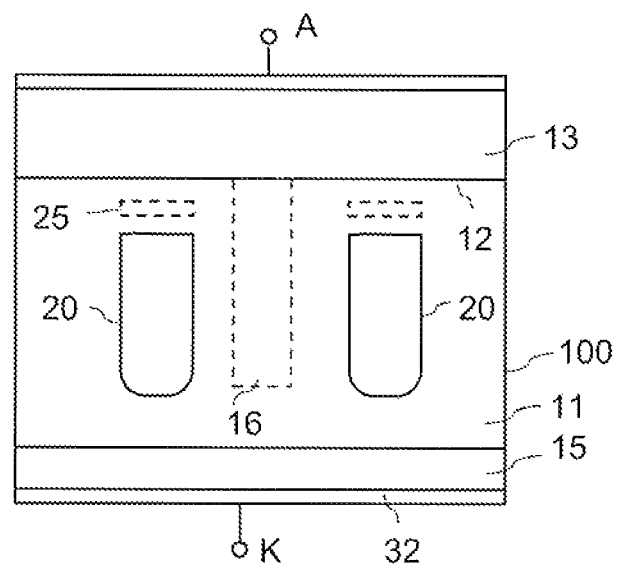
FIG. 21 illustrates an embodiment of a semiconductor device implemented as a diode.

FIG. 21 illustrates an embodiment of a semiconductor device implemented as a diode. In this semiconductor device the further device region 13 is either a semiconductor region of a doping type complementary to the drift region 11, so as to form a bipolar diode, specifically a p-i-n diode, or the further device region 13 is a Schottky region, so as to form a Schottky diode. The further device region 13 forms a first emitter region of the diode. The diode further includes a second emitter region 15 of the same doping type as the drift region 11 but more highly doped. The first emitter region 15 is connected to the first electrode 31 that forms an anode terminal, and the second emitter region 15 is connected to the second electrode 32 that forms a cathode terminal K of the diode in this embodiment.

The diode according to FIG. 21 can be operated like a conventional diode. When a voltage is applied between the anode and cathode terminals A, K that reverse biases the pn junction between the drift region 11 and the first emitter region 13, field electrodes (not shown in FIG. 17) of the field electrode structures 20 are biased as explained before so as to provide counter charges to dopant charges in the drift region 11.

Referring to the explanation above, electric charges are stored in the field electrode structures 20 when the semiconductor device is switched into an off-state. Charges stored in the field electrode structures 20 have corresponding charges in the form of ionized dopant atoms in the drift region 11. When the semiconductor device switches off and when there are several field electrodes arranged adjacent in the current flow direction of the drift region 11, the individual field electrodes 21 are subsequently charged as the depletion region expands in the drift region 11 and as the voltage across the drift region 11 increases. Thus, field electrodes closer to the pn junction 12 are charged before field electrodes more distant to the pn junction 12 are charged.

Storing charges in the field electrodes 21 and the drift region 11, respectively, requires electric energy. This energy, that is often referred to as $E_{OSS}$, is dependent on the total amount of electrical charge stored in the semiconductor device and is dependent on the voltage at which these charges are stored. For storing charges in a field electrode 21 close to the pn junction 12 less energy is required than for storing the same amount of charges in a field electrode more distant to the pn junction 12, because the field electrode 21 more distant to the pn junction 12 is charged when the voltage across the drift region 11 has increased to higher values. The energy required to store charges in the semiconductor device at the time of switching off contributes to the switching losses of the semiconductor device. In order to reduce the switching losses, the semiconductor device optionally includes a compensation region 16 of a second doping type complementary to the first doping type of the drift region 11. The compensation region 16 is arranged in the drift region 11 so that there is a pn junction between the drift region 11 and the compensation region 16. Further, the compensation region 16 is electrically coupled to the device region 13. Compensation regions 16 are schematically illustrates (in dashed lines) in the semiconductor devices illustrated in FIGS. 13, 15 and 17 to 21. In these embodiments, the compensation region 16 adjoins the device region 13, which is a body region when the semiconductor device is implemented as a MOSFET. In a semiconductor device implemented with a plurality of transistor cells a compensation region 16 can be associated with each transistor cell and connected to the body region 13 of the individual transistor cell.

In the current flow direction of the semiconductor device, the compensation region 16 extends over a significant part of the length of the drift region 11. The "length" of the drift region 11 is the dimension of the drift region 11 between the pn junction 12 and the drain region or emitter region 15.

The operating principle of the compensation region 16 corresponds to the operating principle of a compensation region in a conventional superjunction semiconductor device and is explained in the following. In the on-state of the semiconductor device, the voltage across the pn junction between the drift region 11 and the compensation region 16 corresponds to the voltage between the first load terminal 31 (source terminal) connected to the device region 13 (body region) and the second load terminal 32 connected to the drain region or emitter region 15. In a MOSFET, the pn junction between the drift region 11 and the compensation region 16 is always reverse biased when the MOSFET is in a forward operation mode (which is an n-type MOSFET when a positive voltage is applied between the drain and source terminals D, S). However, when the MOSFET is in an on-state, the voltage difference between the first and second load terminals 31, 32 (source and drain terminals) is relatively low, so that there is only a small depletion region around this pn junction. In a diode, the pn junction between the drift region 11 and the compensation region 16 is forward biased when the diode is in the on-state.

When the semiconductor device is switched off so that the voltage difference between the first and second load terminals 31, 32 increases, a depletion region expands in the drift region 11 from both, the pn junction 12 between the device region 13 and the drift region 11 and from the pn junction between the drift region 11 and the compensation region 16. Referring to the explanation above, the expansion of the depletion region involves storing charges in the drift region 11 in the form of ionized dopant atoms. Since the compensation region 16 extends deep into the drift region 11 and since the area of the pn junction between the drift region 11 and the compensation region 16 is large relative to the area of the pn junction between the drift region 11 and the device region 13, large parts of the volume of the drift region 11 become depleted at low voltages between the load terminals 31, 32, which means at voltages before the depletion region expanding from the pn junction 12 between the drift region 11 and the device region 13 reaches the first field electrode structure 20. Thus, switching losses are reduced by virtue of providing the compensation region 16.

Different from conventional superjunction devices, that only include a drift region and a compensation region and that do not include a field electrode structure as explained herein above, an exact balance of dopant atoms in the drift region 11 and the compensation region 16 is not necessary. In conventional superjunction devices the overall number of dopant atoms in the drift region should correspond to the overall number of dopant atoms in the compensation region so that each dopant atom in the drift region finds a corresponding dopant atom in the compensation region. In the semiconductor devices explained herein before, however, the overall number of dopant atoms in the drift region 11 can be higher than the overall number of dopant atoms in the compensation region 16, because the field electrode structures 20 additionally provide for a compensation effect.

Figure 22:
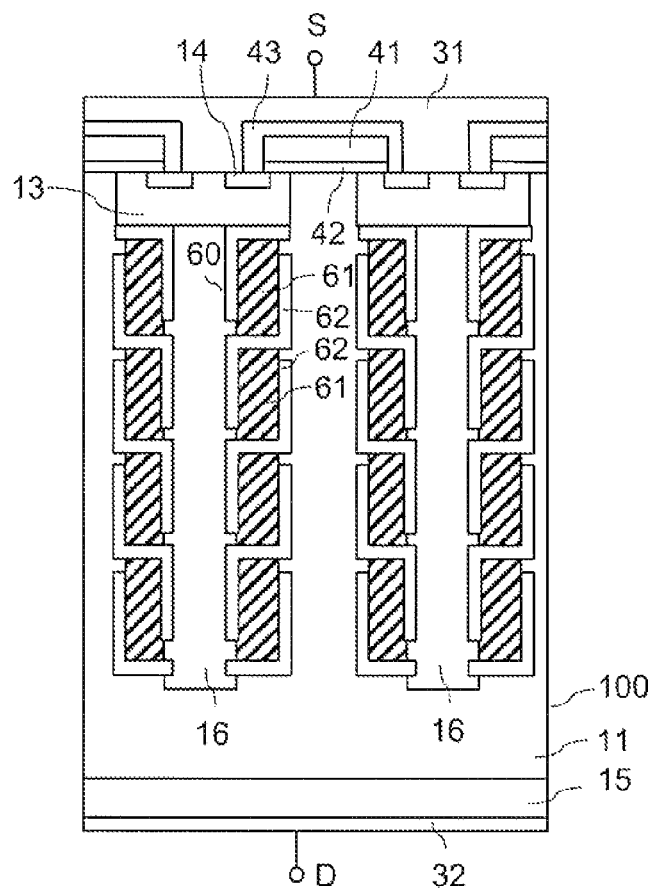
FIG. 22 illustrates an embodiment of a semiconductor device including a drift region, a compensation region and a field electrode structure arranged between the drift region and the compensation region and coupled to the drift region and the compensation region.

FIG. 22 illustrates a vertical cross sectional view of a semiconductor device according to a further embodiment. The semiconductor device of FIG. 22 is implemented as a MOSFET with a planar gate electrode 41. However, the semiconductor device could be implemented as a MOSFET with a trench electrode as explained with reference to FIGS. 17 and 18 or as a Schottky diode, as explained with reference to FIG. 21 as well.

Referring to FIG. 22, the semiconductor device includes a drift region 11 of a first doping type and a compensation region 16 of a second doping type complementary to the first doping type. The compensation region 16 is electrically connected to the first load terminal 31 (source terminal). For this, the compensation region 16 adjoins the body region 13, with the body region 13 being electrically connected to the source terminal 31.

The semiconductor device further includes at least one field electrode structure 60 with a field electrode 61 and a field electrode dielectric 62. The at least one field electrode structure 60 is arranged between the drift region 11 and the compensation region 16. In the embodiment illustrated in FIG. 22, a plurality of field electrode structures 60 are arranged adjacent in the current flow direction of the semiconductor device. The current flow direction is the vertical direction of the semiconductor body 100 in the semiconductor device illustrated in FIG. 22. One of these field electrode structures 60 is illustrated in detail in FIGS. 23 and 24.

Figure 23:
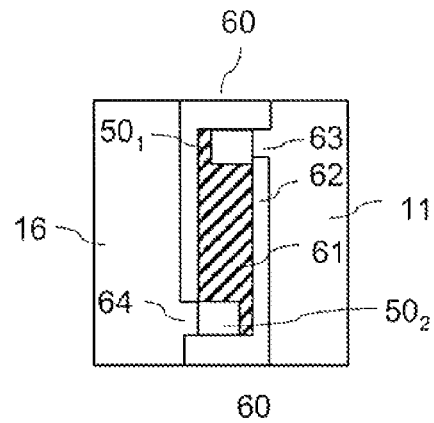
FIG. 23 illustrates an embodiment of one field electrode structure of FIG. 22 in detail.
Figure 24:
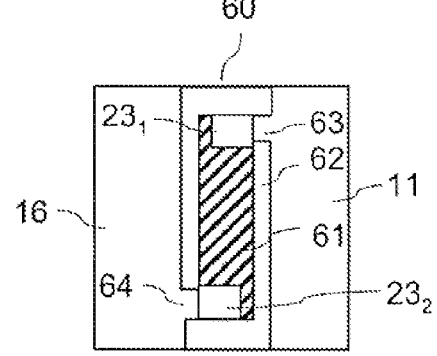
FIG. 24 illustrates an embodiment of a field electrode structure including field stop regions in detail.

Referring to FIGS. 23 and 24, the field electrode dielectric 62 includes a first opening 63 through which the field electrode 61 is coupled to the drift region 11, and a second opening 64 through which the field electrode 61 is coupled to the compensation region 16. According to one embodiment, the field electrode 61 does not extend through the first and second openings 63, 64 into the drift region 11 and the compensation region 16, respectively.

In the embodiment illustrated in FIG. 22, the field electrode structures 60 separate the drift region 11 from the compensation region 16 in a direction perpendicular to the current flow direction, so that the compensation region 16 adjoins the drift region 11 only at a longitudinal end of the compensation region 16 distant to the body region 13.

The material composition and the dimensions of the field electrode dielectric 62 may correspond to the material composition and the dimensions of the field electrode dielectric 22 explained herein before. The material composition of the field electrode 61 may correspond to the material composition of the field electrode 21 explained herein before. Further, the field electrode 61, like the field electrode 21 explained herein before, includes at least one field stop region and/or at least one generation region.

The at least one generation region can implemented like the generation region 50 explained with reference to FIGS. 1 to 15 before. According to one embodiment, the field electrode 61 includes a doped polycrystalline semiconductor material, such as polysilicon. The generation region can be implemented in many different ways. According to one embodiment, the field electrode 61 itself acts as a generation region, or, to be more precise, crystal defects or deep-level traps of the field electrode act as generation regions. According to a further embodiment, a metal region or a metal-compound region, such as a silicide region, is implemented in the field electrode 61 and acts as a generation region. According to one embodiment, there is only one such generation region in the field electrode 61. According to a further embodiment, illustrated in FIG. 23, there are at least two generation regions in the field electrode 61, namely a first generation region $50_1$ connecting the drift region through the first opening 63 to the field electrode 61, and a second generation region $50_2$ connecting the compensation region 16 through the second opening 64 to the field electrode 61. The polycrystalline field electrode 61 can be either n-doped or p-doped.

FIG. 24 illustrates an embodiment of a field electrode structure 60 that includes field stop regions $23_1$, $23_2$ of different doping types in the field electrode 61. Each of these field stop regions $23_1$, $23_2$ can be implemented like the field stop region 23 explained with reference to FIGS. 1 to 15 before. Referring to FIG. 24, a first field stop region $23_1$ is arranged in the region of the first opening 63 and is a doped semiconductor region of the same doping type as the drift region 11 but more highly doped. The second field stop region $23_2$ has the same doping type as the compensation region 16 and is arranged in the region of the second opening 64 and has a doping concentration that is higher than the doping concentration of the compensation region 16.

Referring to FIGS. 22, 23 and 24, in one field electrode dielectric 62 separating one field electrode 61 from the drift region 11 on one side and from the compensation region 16 on the other side, the first opening 63 is closer to the source and body region 13, 14 in the current flow direction of the semiconductor device than the second opening 64. According to one embodiment, one field electrode 61 has a first longitudinal end and a second longitudinal end, wherein the first opening 63 is close to the first longitudinal end, and the second opening 64 is close to the second longitudinal end of the field electrode 61.

The operating principle of the semiconductor device according to FIG. 22 is explained below. For explanation purposes it is assumed that the semiconductor device is an n-type MOSFET with an n-doped drift region 11, a p-doped compensation region 16, n-doped source and drain regions 14, 15 and a p-doped body region 13. The drift region 11 and the compensation region 16 are electrically coupled through the field electrodes 61 of the individual field electrode structures 60.

In the on-state, when a positive voltage is applied between the second load terminal 32 (drain terminal D) and the first load terminal 31 (source terminal S), the voltage between the drift region 11, that is connected to the drain terminal D through the drain region 15, and the compensation region 16, that is connected to the source terminal S via the body region 13, corresponds to the voltage between the drain and source terminals D, S. Since the voltage between the drain and source terminals D, S is relatively low when the semiconductor device is in the on-state, there are no significant depletion regions in the drift region 11 and the compensation region 16 when the device is in the on-state.

When the semiconductor device is switched off, the voltage between the first and second load terminals 31, 32 and, consequently, between the drift region 11 and the compensation region 16 increases. This increase of the voltage between the drift region 11 and the compensation region 16 causes depletion regions to expand in the drift region 11 as well as in the compensation region 16. The operating principle of the field electrode structures 60 of FIG. 22 corresponds to the operating principle of the field electrode structure 20 of FIGS. 1 to 15, with the difference that the field electrode structure 60 of FIG. 22 generates two types of charge carriers, namely n-type charge carriers (electrons) accumulating along the field electrode dielectric 62 between the field electrode 61 and the drift region 11 and p-type charge carriers accumulating along the field electrode dielectric 62 between the field electrode 61 and the compensation region 16. The n-type charge carriers are counter charges to ionized (n-type) dopant atoms in the drift region 11, and the p-type charge carriers are counter charges to ionized (p-type) dopant atoms in the compensation region 16.

The counter charges accumulating in the field electrode 61 along the field electrode dielectric 62 are generated as the voltage between the drift region 11 and the compensation region 16 increases when the semiconductor device is switched off. The voltage between the drift region 11 and the compensation region 16 corresponds to the voltage across the field electrodes 61 of the individual field electrode structures 60. The voltage across the field electrode 61 causes the field stop regions $23_1$, $23_2$ and/or the at least one generation region $50_1$, $50_2$ to generate charge carriers in the field electrode 61 or adjacent the field electrode 61 that act as counter charges.

In the semiconductor device of FIG. 22, the individual field electrode structures 60 are coupled to the body region 13 via the compensation region 16 and to the drain region 16 via the drift region 11. Thus, at the beginning of the switch-off process, the voltages across the individual field electrodes 61 are approximately the same, so that in each of the field electrodes 61 counter charges are generated at an early stage of the switch-off process, which means at low load voltages.

Figure 25:
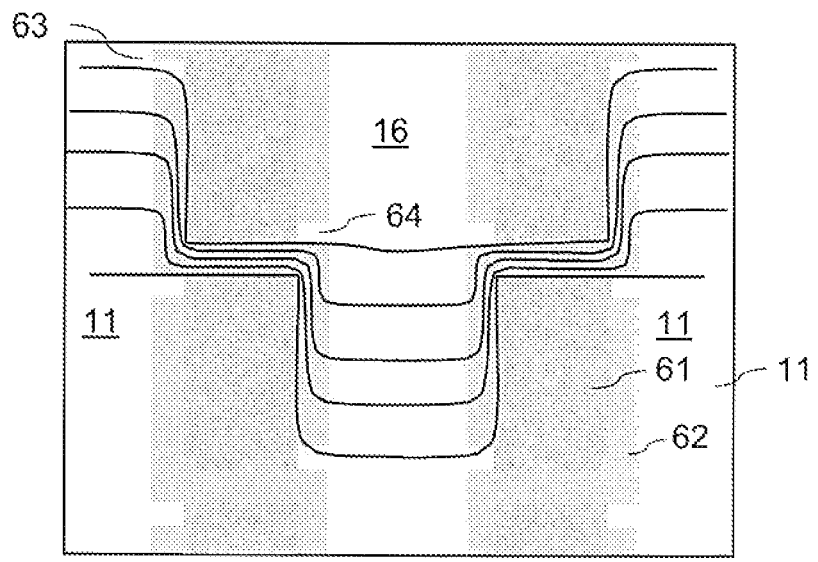
FIG. 25 illustrates equipotential lines in a semiconductor device according to FIG. 22 when the semiconductor device is in an off-state.

FIG. 25 schematically illustrates equipotential lines of an electric field when the semiconductor device is in an off-state. As can be seen from FIG. 25, there is no electric field in the individual field electrodes 61, so that each field electrode 61 has one electrical potential. This electrical potential corresponds to the electrical potential in the drift region 11 close to the first opening 63 and the electrical potential in the compensation region 16 close to the second opening 64.

Figure 26:
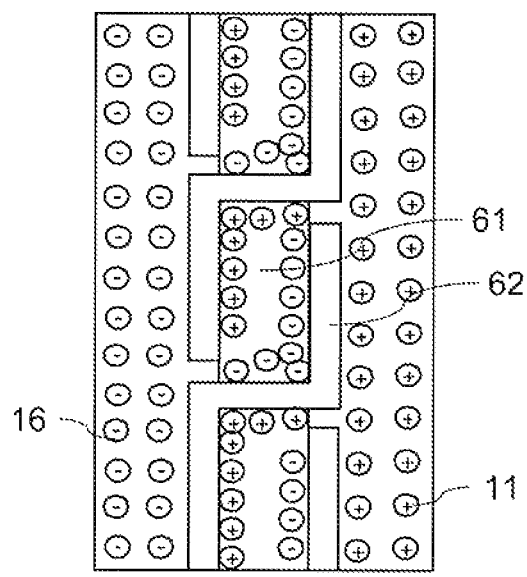
FIG. 26 schematically illustrates the charge distribution in the field electrode structure, the drift region and the compensation region when the semiconductor device is an off-state.

FIG. 26 schematically illustrates the charge distribution in the drift region 11, the compensation region 16 and the field electrodes 61 when the device is in the off-state. The positive charges that are schematically illustrated in the drift region 11 according to FIG. 26 are ionized n-type dopant atoms (donators), and the negative charges schematically illustrated in the compensation region 16 of FIG. 26 are ionized p-type dopant atoms (acceptors). The ionized dopant atoms in the drift region 11 and the compensation region 16 have corresponding charges (counter charges) located along the field electrode dielectric 62.

In the semiconductor device according to FIG. 22 a large volume of the drift region 11 is depleted at relatively low voltages between the first and second load terminals 31, 32, so that switching losses are low. Further, counter charges to ionized dopant atoms in the drift region 11 and the compensation region 16 are provided through the field electrode structures 60, so that no doping charge balance between the drift region 11 and the compensation region 16 is required. If there is an unbalance, which means if the drift region 11 adjacent the field electrode structure 60 includes more dopant charges than the compensation regions 16 adjacent the field electrode structure 60, the field electrode structure 60 "auto-matically" generates the required number of counter charges for the one of the drift region 11 and the compensation region 16 that has more dopant charges. According to one embodiment, the overall number of dopant charges in the drift region 11 is higher than the overall number of dopant charges in the compensation region 16.

Referring to FIG. 22, the field electrode structures 60 separate the compensation region 16 and the drift region 11 in a direction perpendicular to the current flow direction. Thus, the compensation region 16 does not adjoin the drift region 11 in this direction, so that dopant atoms from one of these regions cannot diffuse into the other one of these regions during a manufacturing process of the semiconductor device. Through this, the drift region 11 and the compensation region 16 can be implemented as very narrow semiconductor regions having a width of 1 micrometer (μm) and less.

According to one embodiment (not illustrated), the width of the drift region 11 widens in the direction of the drain region 15, while the width of the compensation regions widens in the direction of the compensation region 16.

Figure 27:
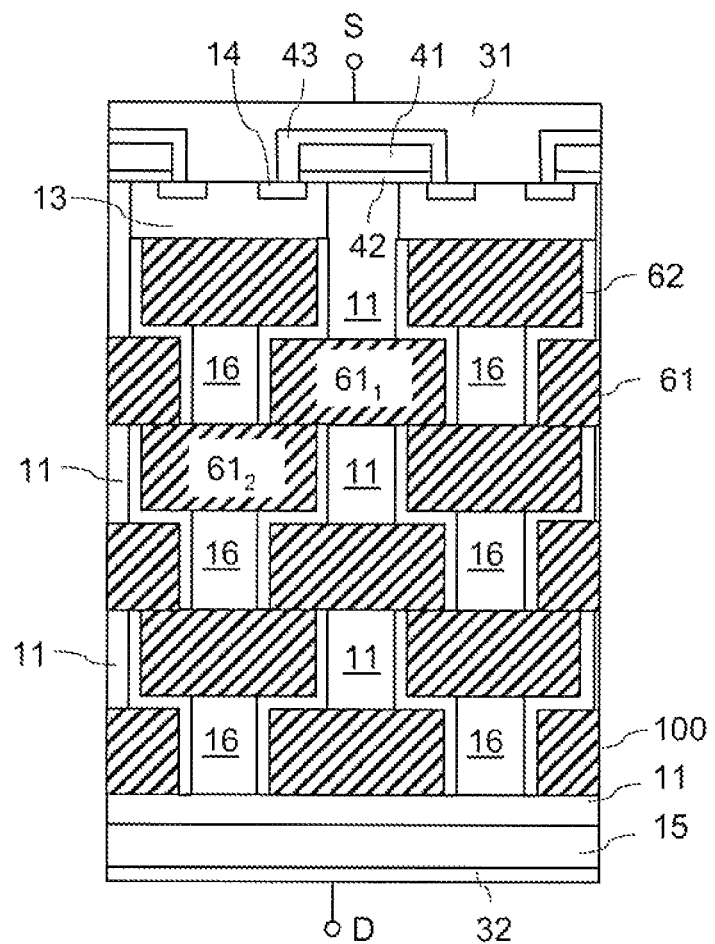
FIG. 27 illustrates a further embodiment of a semiconductor device including a drift region, a compensation region and a field electrode structure.

FIG. 27 illustrates a further embodiment of a semiconductor device including drift regions 11, compensation regions 16 and field electrode structures 60 with field electrodes 61 and field dielectrics 62 arranged between the drift regions 11 and the compensation regions 16. In this embodiment, the drift region 11 has a plurality of drift region sections 11 that are distant in the current flow direction and separated by field electrodes 61. The individual sections of the drift region 11 adjoin the field electrode 61. Further, the compensation regions 16 include a plurality of compensation regions 16 arranged distant in the current flow direction and separated by the field electrodes 61. In this embodiment, each field electrode 61 has two sections, a first section $61_1$ arranged between two sections of the drift region 11 and electrically connected to these sections of the drift region 11, and a second section $61_2$ arranged between two sections of the compensation region 16 and adjoining these sections of the compensation region 16. The drift region 11 is dielectrically insulated from the second field electrode section $61_2$ and the compensation regions 16 are dielectrically insulated from the first field electrode sections $61_1$ through field electrode dielectric 62. One section of the drift region 11 and one section of the compensation region 16 that are connected through one field electrode 61 are located offset in the current flow direction.

Figure 28:
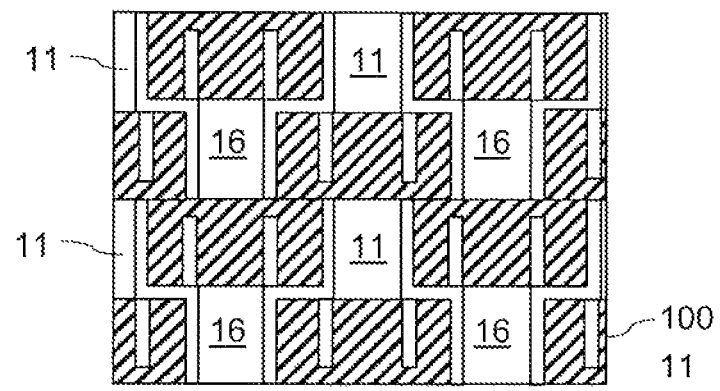
FIG. 28 illustrates a modification of the field electrode structure of FIG. 27.

FIG. 28 illustrates a modification of the field electrode structures 60 of FIG. 27. While in the embodiment of FIG. 27 (like in the embodiment of FIG. 22), the field electrode dielectrics 62 have two L-shaped sections that are centrally symmetric, the field electrode dielectrics 62 of FIG. 28 are basically H-shaped.

Figure 29:
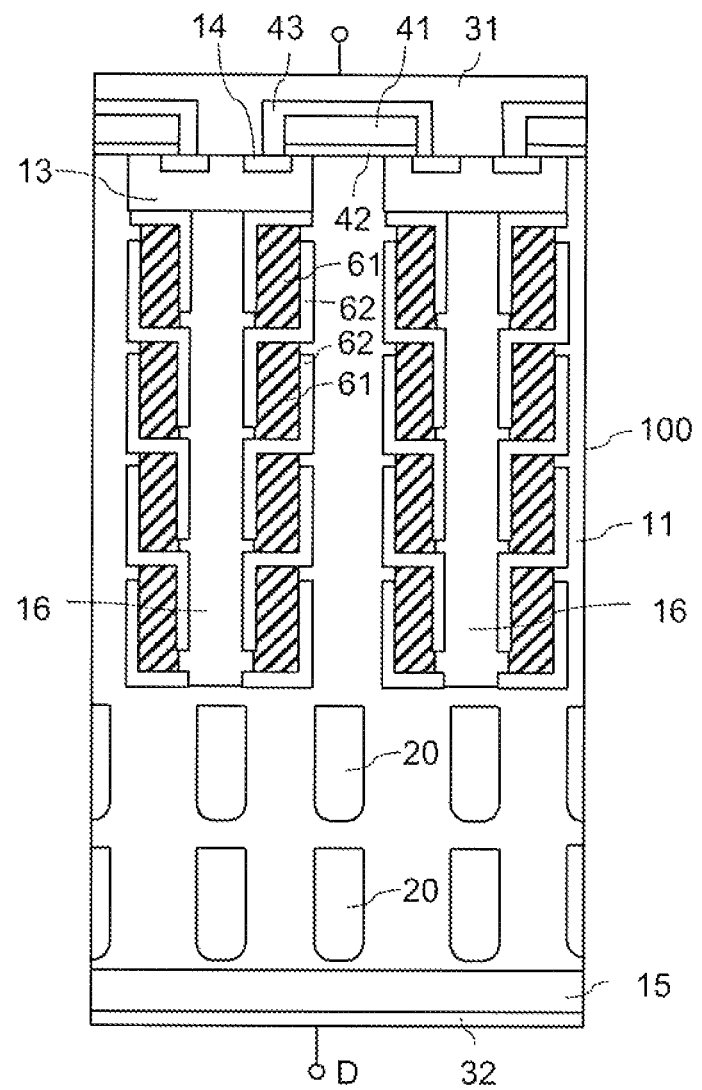
FIG. 29 illustrates an embodiment of a semiconductor device including a drift region, a compensation region and a field electrode structure arranged between the drift region and the compensation region and further including field electrode structures in the drift region.

FIG. 29 illustrates a further embodiment of a semiconductor device. The semiconductor device includes drift regions 11 and compensation regions 16 separated by field electrode structures 60 in a region close to the body region 13, and includes field electrode structures 20 according to one of the embodiments explained with reference to FIGS. 1 to 21 in a region closer to the drain region 15.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a drift region of a first doping type, a junction between the drift region and a device region, a compensation region of a second doping type, and at least one field electrode structure arranged between the drift region and the compensation region and comprising:
a field electrode; and
a field electrode dielectric adjoining the field electrode, the field electrode dielectric arranged between the field electrode and the drift region and between the field electrode and the compensation region and comprising a first opening through which the field electrode is coupled to the drift region and a second opening, separated from the first opening by a portion of the field electrode dielectric, through which the field electrode is coupled to the compensation region.

2. The semiconductor device of claim 1, wherein the field electrode comprises an electrically conductive material.

3. The semiconductor device of claim 1, wherein the field electrode comprises one of a metal, a silicide, or a polysilicon.

4. The semiconductor device of claim 1, wherein the field electrode dielectric further comprises:
a first field stop region of the same doping type as the drift region and more highly doped than the drift region, the first field stop region connecting the field electrode to the drift region through the first opening of the field electrode dielectric; and
a second field stop region of the same doping type as the compensation region and more highly doped than the compensation region, the second field stop region connecting the field electrode to the compensation region through the second opening of the field electrode dielectric.

5. The semiconductor device of claim 1, wherein the first opening is located closer to the device region in a current flow direction of the semiconductor device than the second opening.

6. The semiconductor device of claim 1, further comprising:
a plurality of field electrode structures arranged next to each other in a current flow direction of the semiconductor device and adjoining one another, so that the plurality of field electrode structures separates the compensation region from the drift region in a direction perpendicular to the current flow direction.

7. A semiconductor device, comprising a drift region of a first doping type, a junction between the drift region and a device region, and at least one field electrode structure in the drift region, the field electrode structure comprising:
a field electrode;
a field electrode dielectric adjoining the field electrode and arranged between the field electrode and the drift region, and having an opening;
at least one of a field stop region and a generation region, the field stop region of the first doping type and more highly doped than the drift region, the field stop region connecting the field electrode to the drift region through the opening of the field electrode dielectric, the generation region connecting the field electrode to the drift region through the opening of the field electrode dielectric or arranged in the field electrode; and
a compensation region of a second doping type adjoining the drift region and connected to the device region.

8. The semiconductor device of claim 7, wherein the field electrode includes a semiconductor material of the first doping type but more highly doped than the drift region.

9. The semiconductor device of claim 7, wherein the field electrode includes one of a metal, and a polycrystalline semiconductor material.

10. The semiconductor device of claim 7, wherein a section of the field electrode adjoins the drift region.

11. The semiconductor device of claim 10, wherein the field electrode includes at least one of a metal and a polycrystalline semiconductor material.

12. The semiconductor device of claim 7,
wherein the semiconductor device has a current flow direction, and
wherein the field stop region does not extend more than 200 nm beyond the field electrode dielectric into the drift region in a direction perpendicular to the current flow direction.

13. The semiconductor device of claim 7,
wherein the semiconductor device has a current flow direction, and
wherein the field stop region does not extend beyond the field electrode dielectric in a direction perpendicular to the current flow direction.

14. The semiconductor device of claim 7, wherein the opening of the field electrode dielectric is located in the direction of the junction.

15. The semiconductor device of claim 7, wherein the at least one field electrode structure comprises a shielding region arranged distant to the opening of the field electrode dielectric in a current flow direction of the semiconductor device.

16. The semiconductor device of claim 7, further comprising:
a plurality of field electrode structures arranged distant to each other in a current flow direction of the semiconductor device.

17. The semiconductor device of claim 16, wherein the field stop regions of the individual field electrode structures of the plurality of field electrode structures are implemented such that at least some of the field stop regions adjoin the field electrode dielectric of a neighboring field electrode structure.

18. The semiconductor device of claim 7,
wherein the semiconductor device is implemented as a MOS transistor in which the device region is a semiconductor region of a second doping type and forms a body region, and wherein the MOS transistor further comprises:
a source region, wherein the body region is arranged between the drift region and the source region;
a drain region, wherein the drift region is arranged between the drain region and the body region; and
a gate electrode arranged adjacent the body region and dielectrically insulated from the body region by a gate dielectric.

19. The semiconductor device of claim 7, wherein the semiconductor device is implemented as a bipolar diode and the device region is a semiconductor region of a second doping type and forms an emitter region.

20. The semiconductor device of claim 7, wherein the semiconductor device is implemented as a Schottky diode and the device region is a Schottky region.

21. The semiconductor device of claim 7, wherein the generation region includes an interface region between the field electrode and the drift region.

22. The semiconductor device of claim 21, wherein the field electrode includes a metal or a silicide.

23. The semiconductor device of claim 7, wherein the field electrode comprises one of a polycrystalline or amorphous semiconductor material, or a monocrystalline semiconductor region with foreign material atoms included therein or with crystal defects.

24. The semiconductor device of claim 7, wherein the generation region comprises a void.

* * * * *